(12) United States Patent
Kondoh

(10) Patent No.: US 7,651,671 B2
(45) Date of Patent: Jan. 26, 2010

(54) METHOD OF ADDING LOW-PRESSURE GAS CONTINUOUSLY TO SUPERCRITICAL FLUID AND APPARATUS THEREFOR

(75) Inventor: Eiichi Kondoh, Kofu (JP)

(73) Assignee: National University Corporation University of Yamanashi, Yamanashi (JP)

(*) Notice: Subject to any disclaimer, the term of this patent is extended or adjusted under 35 U.S.C. 154(b) by 498 days.

(21) Appl. No.: 11/574,438

(22) PCT Filed: Aug. 29, 2005

(86) PCT No.: PCT/JP2005/015660

§ 371 (c)(1),
(2), (4) Date: Feb. 28, 2007

(87) PCT Pub. No.: WO2006/025325

PCT Pub. Date: Mar. 9, 2006

(65) Prior Publication Data

US 2009/0003124 A1 Jan. 1, 2009

(51) Int. Cl.
*B01J 3/00* (2006.01)
*G05D 16/00* (2006.01)
*B01F 15/02* (2006.01)
*F16K 11/074* (2006.01)

(52) U.S. Cl. ........................ 422/242; 422/112; 422/113; 422/117; 422/306; 366/101; 366/181.3; 366/106; 366/189; 137/625.46

(58) Field of Classification Search ................. 422/112, 422/113, 117, 306, 211, 213, 242; 366/101, 366/181.3, 106, 189; 137/625, 625.46
See application file for complete search history.

(56) References Cited

U.S. PATENT DOCUMENTS 6,579,501 B1 * 6/2003 Knapp et al. ................ 422/208

FOREIGN PATENT DOCUMENTS

JP 11-197494 7/1999

(Continued)

OTHER PUBLICATIONS

D. W. Matson, et al., "Rapid Expansion of Supercritical Fluid Solutions: Solute Formation of Powders, Thin Films, and Fibers", Ind. Eng. Chem. Res. 1987, 26, 2298-2306.

*Primary Examiner*—Walter D Griffin
*Assistant Examiner*—Lessanework Seifu
(74) *Attorney, Agent, or Firm*—Antonelli, Terry, Stout & Kraus, LLP.

(57) ABSTRACT

The present invention is for dissolving a metal complex and a low-pressure additive gas in a supercritical fluid and supplying the same continuously to a reaction vessel, aiming to provide a method and an apparatus for adding a low-pressure gas to a high-pressure supercritical fluid continuously, so that a gas which should be handled with care, such as a combustible gas, can be added to a supercritical fluid without compression. The method for continuously adding a low-pressure gas to a supercritical fluid comprises supplying a reactant gas to a supercritical fluid or a subcritical fluid by repeating, in an alternate manner, a step of storing a reactant gas midway through a piping in a low-pressure state and a step of carrying the reactant gas toward a reaction vessel with the supercritical fluid or the subcritical fluid, so that the reactant gas is continuously charged in the reaction vessel.

10 Claims, 13 Drawing Sheets

FOREIGN PATENT DOCUMENTS

| | | |
|---|---|---|
| JP | 2003-024763 | 1/2003 |
| JP | 2003-024793 | 1/2003 |
| JP | 2003-062446 | 3/2003 |
| JP | 2003-514115 | 4/2003 |
| JP | 2003-213425 | 7/2003 |
| JP | 2004-225152 | 8/2004 |
| JP | 2004-228526 | 8/2004 |
| WO | WO 01/32951 A2 | 5/2001 |

\* cited by examiner

<STATE A>

<STATE B>

<PIPING COMMUNICATED WITH REACTION VESSEL>

STATE A

STATE B

METHOD OF ADDING LOW-PRESSURE GAS CONTINUOUSLY TO SUPERCRITICAL FLUID AND APPARATUS THEREFOR

TECHNICAL FIELD

The present invention relates to a method of adding a low-pressure gas which serves as a reaction auxiliary continuously to a supercritical fluid, and to an apparatus therefor. The method and apparatus are usable, for example, in a process of dissolving a reaction auxiliary and a metal precursor into a supercritical fluid or a subcritical fluid and forming a thin film on a substrate.

BACKGROUND ART

In recent years, a technology to synthesize substances without using substances having much effects on environment such as organic solvents is required. When a gas such as $CO_2$ is maintained at a point higher than a critical point, it is converted into a supercritical state in which there is no boundary between gas and liquid. A substance in the supercritical state is a fluid which is neither liquid nor gas, and is referred to as a supercritical fluid.

Downsizing of integrated circuits is in steady progress. In the related art, a super-micro-fabrication process such as manufacture of the integrated circuits is generally performed with a dry process (vacuum process) in vacuo, a rarefied gas environment, or a plasma discharge environment.

The dry process has been developed as an extremely effective measure because independent atomic elements or molecules, or ions thereof can be used directly for processing. However, in the vacuum process, maintenance of vacuum and generation of plasma increase the cost. In a wet process in which a liquid is used for plating or cleaning, a large quantity of waste liquid is generated, which presents a serious environmental problem.

The supercritical fluid using $CO_2$ as a medium has a property between liquid and gas, and has peculiar properties such that surface tension is zero and the capability to dissolve other substances (solvation capability) is high. In addition, it also has advantages such as chemical stability, inexpensiveness, harmless, and low cost. In addition, there are many characteristics such that recycling of $CO_2$ in itself and substances dissolved in $CO_2$ fluid by vaporization and reliquefaction.

In an integrated circuit manufacturing process, study and development of using the supercritical $CO_2$ are in progress mainly in a wafer cleaning process. For example, in a cleaning process, a process aiming at the salvation energy, the safety and recycling capability of the supercritical $CO_2$ has been developed. The study and development of a micro-fabrication process for forming a nano-level wiring are also in progress taking advantage of the fact that the surface tension is zero in the supercritical $CO_2$.

For example, a main function in manufacture of semiconductor devices is the formation of a thin film, and Rapid Expansion of Supercritical Solution is known as a method of forming a thin film using a supercritical fluid. D. Matson et al disclose a technology of expanding a supercritical fluid containing a source material dissolved therein and forming a supersaturated raw material. A further developed technology is a method of obtaining a thin film of a metal oxide by dissolving an oxide complex in a supercritical fluid and blowing the same onto a heated substrate (see Patent Document 1: JP 2003-213425 A)

The inventors have uniquely developed a method of forming a thin film by dissolving a thin film forming raw material such as an organic metal in a supercritical $CO_2$ and allowing it to undergo a film forming reaction in that state (E. Kondoh and H. Kato, Microelectron. Eng. Vol. 64 (2002), pp. 495), and applies the method to the manufacture of integrated circuit wirings such as filling Cu into via holes or trenches, and the formation of a Cu diffusion barrier layer (Japanese Patent Application No. 2003-17948, "Method of manufacturing semiconductor devices", and Japanese Patent Application No. 2003-17949 "Method of manufacturing semiconductor devices") The similar method is disclosed also in JP 2003-514115 T.

In the processing in a supercritical fluid, addition of a gas as a source material is frequently performed. For example, when decomposing a harmful organic substance such as dioxin using oxidative reaction in a supercritical water instead of burning, an oxidizing gas such as oxygen or air as an oxidizer is used in addition to the supercritical water. It is pointed out that addition of the gas to a supercritical $CO_2$ is necessary when performing coating of fine particles efficiently by the Rapid Expansion of Supercritical Solution (see Patent Document 1: JP 11-197494 A).

When depositing a thin film using a reaction in a supercritical fluid, addition of a gas is further important. For example, the inventors have developed a technology of dissolving Cu $(hfac)_2$, a metal complex, in a supercritical fluid, adding $H_2$ thereto to produce a reduction reaction to obtain a Cu thin film, and proved that when $H_2$ is not added, only the particles are produced, and a thin film is not formed (Report introduced above). In order to deposit a thin film, it is necessary that a heterogeneous reaction occurs continuously on the substrate surface and developing surfaces. In order to cause the reaction to occur on the substrate surface by priority, the substrate surface is required to act catalytically. In the case of precipitation of Cu, the substrate metal aids dissociation of $H_2$.

The inventors developed a technology to obtain a ruthenium oxide $(RuO_2)$ thin film by dissolving bis(cyclopentadienyl)ruthenium $(RuCp_2)$ as a metal complex in a supercritical fluid and causing an oxidative reaction with ozone gas $(O_3)$ added simultaneously (Japanese Patent Application No. 2004-167782). Ozone, being unstable and dissociating on the substrate surface by priority to liberate oxygen atom, reacts easily with the metal precursor, so that the ruthenium oxide is deposited.

Patent Document 1: JP 2003-213425 A
Non-Patent Document 1: J. Mater. Sci. Soc. Vol. 22, No. 6, 1918 (1987)
Patent Document 2: JP 2003-514115 T
Patent Document 3: JP 11-197494 A

DISCLOSURE OF THE INVENTION

Problems That the Invention is to Solve

However, in order to add a gas to a high-pressure supercritical fluid, it is necessary to compress the gas to a pressure equal to or higher than the supercritical fluid. For example, in the supercritical hydroxylation reaction, air is brought into a high pressure using a compressor, and is added to a supercritical water. Compression of a gas as such requires a large scale apparatus which costs much and, in addition, it is extremely dangerous especially when a highly reactive gas or a combustible gas is added. Examples of the above-described gas includes $O_2$, air, $H_2$, $O_3$ as well as $N_2O$, $NH_3$, $H_2S$ in JP 2003-514115 T described above for example and other almost all types of gases which are required for synthesis.

Another method of adding a gas in a reaction process using a supercritical fluid is a batch method. That is, the additive gas is encapsulated in a reaction vessel, and then a medium fluid is supplied in a gas or liquid state. Subsequently, when the temperature of the reaction vessel is raised or the pressure is raised by further supplying the medium fluid, the interior exceeds the critical point, and hence is brought into a supercritical flow state.

Although the batch method is used quite generally, the amount of composition that can be achieved in one operation is limited since all the materials are encapsulated. This causes an upper limit in film thickness in the case of deposition of a thin film. In addition, the condition of processing such as the concentrations of the materials in the reaction vessel change continuously. For example, as the synthesis proceeds, by-products of the reaction are condensed, whereby impurities caused thereby may be contained easily therein.

The problems described above may be solved by dissolving a metal complex and a low-pressure additional gas in a supercritical fluid and supplying them continuously into a reaction vessel. However, such a method has not been developed thus far.

The present invention is for dissolving a metal complex and a low-pressure additive gas in a supercritical fluid and supplying the same continuously to a reaction vessel, aiming to provide a method and an apparatus for adding a low-pressure gas to a high-pressure supercritical fluid continuously, so that a gas which should be handled with care, such as a combustible gas, can be added to a supercritical fluid without compression.

Means for Solving the Problems

That is, the method of adding a low-pressure gas continuously to a supercritical fluid according to the present invention comprises supplying a reactant gas to a supercritical fluid or a subcritical fluid by repeating, in an alternate manner, a step of storing the reactant gas midway through a piping in a low-pressure state and a step of carrying the reaction gas toward a reaction vessel with the supercritical fluid or the subcritical fluid, so that the reactant gas is continuously charged in the reaction vessel.

In one embodiment, the method of adding a low-pressure gas continuously to a supercritical fluid according to the present invention is characterized in that the step of storing the reactant gas in a low-pressure state is performed at a temperature being maintained at a supercritical or subcritical temperature or higher.

The apparatus for adding a low-pressure gas continuously to a supercritical fluid according to the present invention comprises; a piping system for transporting a supercritical fluid or a subcritical fluid to a reaction vessel and a piping system for adding and mixing a reactant gas at an adding and mixing portion midway through the piping system, wherein the adding and mixing portion comprises a means for storing the reactant gas in a low-pressure state, a means for carrying the stored reactant gas toward the reaction vessel with the supercritical fluid or the subcritical fluid, and a switch valve for switching the respective means.

In one embodiment, the apparatus for adding a low-pressure gas continuously to a supercritical fluid according to the present invention is characterized in that the means for storing the reactant gas in a low-pressure state has a stirring means.

In another embodiment, the apparatus for adding a low-pressure gas continuously to a supercritical fluid according to the claimed invention is characterized in that the switch valve for switching the means for storing the reactant gas in a low-pressure state and the means for carrying the stored reactant gas toward the reaction vessel with the supercritical fluid or the subcritical fluid is a hexagonal valve.

In another embodiment, the apparatus for adding a low-pressure gas continuously to a supercritical fluid according to the present invention is characterized in that the switch valve integrates therein the means for storing the reaction gas in a low-pressure state.

In another embodiment, the apparatus for adding a low-pressure gas continuously to a supercritical fluid according to the present invention is characterized in that the means for storing the reactant gas in a low-pressure state integrated in the switch valve includes a loop piping, so that a fluid comprising the supercritical fluid or the subcritical fluid and the reactant gas is stirred to accelerate mixing thereof while passing through the loop piping.

In another embodiment, the apparatus for adding a low-pressure gas continuously to a supercritical fluid according to the present invention is characterized in that the means for storing the reactant gas in a low-pressure state integrated in the switch valve includes a pressure-resistant container having a stirring means, so that a fluid comprising the supercritical fluid or the subcritical fluid and the reactant gas is stirred in the pressure-resistant container to accelerate mixing.

In another embodiment, the apparatus for adding a low-pressure gas continuously to a supercritical fluid according to the present invention is characterized in that a check valve for the supercritical fluid or the subcritical fluid is provided in the piping system for adding and mixing the reactant gas.

In another embodiment, the apparatus for adding a low-pressure gas continuously to a supercritical fluid according to the present invention is characterized in that a shut-off valve for the reaction gas is provided in the piping system for adding and mixing the reactant gas.

Herein, a supercritical fluid means a state of being fluid, which is obtained by maintaining a gas such as $CO_2$ at its critical point or higher to eliminate the boundary between gas and liquid, and is neither liquid nor gas.

A subcritical fluid is a state of a fluid immediately under the critical values.

A metal precursor is a generic designation indicating an organic metallic compound, an organic metal complex, a metal halide, and a complex halide.

Effects of the Invention

Since the method of adding a low-pressure gas continuously to a supercritical fluid and the apparatus therefor according to the present invention are configured as shown above, a gas which should be treated carefully, such as flammable gas which is dangerous when being accompanied with compression or temperature increase, can be added to and mixed with a supercritical fluid or a subcritical fluid at a low pressure without compression.

Therefore, high-security is achieved and, in addition, the reactant gases can be added and mixed to a supercritical fluid or a subcritical fluid with high efficiency.

BEST MODE FOR CARRYING OUT THE INVENTION

Referring now to the drawings, embodiments of the method of adding a low-pressure gas continuously to a supercritical fluid and the apparatus therefor according to the present invention will be described hereinafter.

FIG. 1 is a schematic drawing showing an example of a configuration of an apparatus for implementing the present invention; FIG. 2 is a schematic pattern diagram showing fluids flowing in a piping; FIG. 3 is a schematic drawing showing an example of a thin film deposition apparatus configured using a hydrogen mixer to which the present invention is applied; FIG. 4 is a graph showing a result obtained by Example 1; FIG. 5 is a graph showing a result obtained by Example 2; FIG. 6 is a graph showing a result obtained by Comparative Example; FIG. 7 is a schematic drawing showing another configuration of the apparatus for implementing the present invention; and FIG. 8 is a schematic drawing diagrammatically showing fluids flowing in a piping.

FIG. 1 shows an example in which the method of adding low-pressure gas according to the present invention is configured using a hexagonal valve, and will be described with reference to an example wherein hydrogen ($H_2$) is added to a supercritical fluid of carbon dioxide ($CO_2$).

The hexagonal valve 11 has two piping connecting states, which are referred to as State A and State B. Hydrogen is connected to a connecting port 1, and carbon dioxide is connected to a connecting port 5. A connecting port 2 is connected to an discharge line, and a connecting port 4 is connected to a reaction vessel. A stainless steel pipe of 1/16 inches in outer diameter is used for the piping of this example. Between a connecting port 3 and a connecting port 6, the piping is formed into a loop having an interior capacity of 500 μL, which is a capacity significantly larger than that of the piping in the interior of the hexagonal valve 11. The supply pressure of hydrogen is 0.3 MPa, and the supply pressure of carbon dioxide is 100 MPa. Since the entire hexagonal valve 11 and the piping are heated to 40° C., carbon dioxide is in a supercritical state (the critical point is 7.4 MPa, 31° C.).

In State A, the piping is shunted to connect between the connecting ports 1 and 6, 2 and 3, and 4 and 5, hydrogen is charged in the above-described loop piping 7 and then is discharged, while carbon oxide is supplied to a reaction vessel 8.

When the state is switched to State B after elapse of a predetermined period, the piping is shunted to connect between the connecting ports 1 and 2, 3 and 4, and 5 and 6, and hence hydrogen is directly discharged, while carbon dioxide is connected to the reaction vessel 8 via the loop piping 7. In other words, the passage of the loop piping 7 is switched from the hydrogen side to the carbon dioxide side. Hydrogen charged in the loop piping 7 is pushed into the reaction vessel 8 while being dissolved in carbon dioxide, and only carbon dioxide flows into the loop piping 7.

The above-described loop piping 7 may be of a spiral or coil shape (eddy shape) as a whole, or partly of a loop-shape (ring-shape). When a fluid including a supercritical fluid or a subcritical fluid (for example, carbon dioxide) and a reactant gas (for example, hydrogen) pas therethrough, a rotational force is applied thereto to accelerate stirring and mixing thereof is accelerated.

The stirring performance depends on the number of loops, the diameter of loop, the diameter of the pipe, and the flow velocity. Therefore, the shape of the loop or the like needs to be determined experimentally. In this example, the loop diameter is about 1 cm.

When the state is switched from State B to State A again after elapse of a predetermined period, carbon dioxide charged in the loop piping 7 is rapidly expanded. However, since there is provided a check valve 9 in the piping on the hydrogen side, the carbon dioxide is discharged without flowing in the reverse direction, and hence the inside of the loop piping 7 is replaced by hydrogen.

As a result of the operation shown above, the fluids flowing in the piping are schematically shown in FIG. 2. With the operation of the valve in State A, the fluid of carbon dioxide replaced partly by hydrogen in the piping is supplied to the reaction vessel as shown as State B. Carbon dioxide and hydrogen in the piping are in a supercritical state, and hydrogen can dissolve perfectly in carbon dioxide. Therefore, the fluid is supplied to the reaction vessel in a state in which hydrogen is dissolved therein. The mixture ratio between hydrogen and carbon dioxide can be adjusted by changing the switching interval between States A and B.

The mixture ratio between hydrogen and carbon dioxide is preferably set to a value not more than an explosion limit (lower than 4%) of hydrogen, to keep safety without a risk of explosion.

FIG. 3 shows an example of a thin film deposition apparatus configured with the hydrogen mixer to which the present invention is applied.

Carbon dioxide supplied from a carbon dioxide cylinder 21 is liquidized by a cooling unit 22. The carbon dioxide is supplied to a pump 23 at about 6 MPa, is compressed to 10 MPa, and is connected to a mixer 24. Hydrogen supplied from a hydrogen cylinder 25 is reduced to 0.3 MPa by a depressurizing valve 26, and is connected to the mixer 24. The piping connections of the mixer 24 (State A and State B) are switched at certain intervals by a valve controller 27.

Preferably, a flow rate adjusting valve 28 for limiting the flow rate of hydrogen is provided between the above-described depressurizing valve 26 and the mixer 24. If there is no flow rate adjusting valve 28, excessive hydrogen flows into the discharge line in above-described State B, which is uneconomic, and is also unfavorable in terms of safety. It is also possible to provide a flow meter (not shown). Alternatively, the object of the present invention is also achieved with a configuration to fully close the valve or limit the flow rate in State B synchronously with the state of the hexagonal valve 11.

It is preferable to provide a post-mixer 29 for accelerating mixing of hydrogen and carbon dioxide in downstream of the mixer 24. It may be a spiral mixer or a mechanically stirring device. It is further preferable to provide a shock absorber (damper) 30 for preventing fluctuations of the pressure.

A metal complex as a raw material is stored in a dissolving container 31, and is dissolved and mixed when circulating a supercritical fluid therein. The amount of dissolution is adjusted by changing the temperature or the pressure in the dissolving container 31 or the grain size of the metal complex.

The components are entirely stored in a thermostat 32 maintained at 40° C. The reason why the components are heated entirely is to maintain the fluid in the supercritical state, and the temperature must simply be a temperature equal to or higher than the critical point of the fluid. In this example, the dissolving container 31 is also maintained at the same temperature.

In the configuration as described above, the resulting fluid comprises a supercritical carbon dioxide, hydrogen and the metal complex, and is supplied to the reaction vessel 33. The configuration of the reaction vessel 33 shown in Japanese Patent Application No. 2004-167782 may also be employed (however, members 18, 19 in the drawing in the document are not used, and a discharge port is additionally provided).

The fluid flowing out from the reaction vessel 33 passes through a pressure adjusting valve 34 and reaches a separator 35. The separator 35 evaporates carbon dioxide and hydrogen, and unreacted raw material and low-boiling by-products are collected. The evaporated components are discharged to the outside with the exhaust from the piping system of the above-described hydrogen mixing means. The reaction vessel 33 and the piping extending to the reaction vessel 33 may also be heated to 40° C. and stored in the same thermostat.

Reference numeral 36 in the drawing designates a pressure gauge.

EXAMPLE 1

Hereinafter, a process of mixing $H_2$ when $H_2$ is added to $CO_2$ and carried to the reaction vessel using the apparatus shown in FIG. 1 will be described.

A supercritical $CO_2$ of 10 MPa was supplied from a carbon dioxide side piping system at a rate of 10 mL/min. (conversion at 40° C.), and $H_2$ gas of 0.3 MPa was supplied from the hydrogen side piping system to the loop piping 7 at 0.3 L/min. Since the apparatus and the piping were maintained at 40° C., $CO_2$ was in a supercritical state. The flow rates shown above are values at the respective pressure and temperature.

The capacity of the loop piping 7 was 500•. The state of the hexagonal valve 11 was switched intermittently between State A and State B. The period required for switching the valve was not more than 1 second, which was ignorable. The periods of connection were 10 to 50 seconds for $CO_2$ (State A) and 10 second for $H_2$ (State B), which were repeated alternately.

At this time, the density of the supercritical $CO_2$ is 0.63 g/ML. The number of moles of a fluid flowing for T seconds was as Formula 1 shown below.

$$T(\text{sec.}) \times 1/60 \times 0.63(\text{g/ML}) \times 10(\text{ML/min.}) \times 1/44 = 0.00239T \quad \text{Formula 1}$$

The number of moles of $H_2$ to be dissolved was as shown by Formula 2 shown below, where R designates a gas constant.

$$500 \times 10^{-9}(m^3) \times 0.3 \times 10^6 \times 1/R \times 1/313 = 5.76 \times 10^{-5} \quad \text{Formula 2}$$

Therefore, the $H_2$ concentration is as shown by Formula 3.

$$0.0244/T \times 100(\%) \quad \text{Formula 3}$$

A stirrer was provided at the exit of the apparatus, and a carburetor was used to vaporize at the exit thereof for analysis, and $H_2$ in $CO_2$ was analyzed with a gas chromatograph device. Ar was used as the carrier gas for the analysis.

The result is shown in FIG. 4. It shows a good agreement.

EXAMPLE 2

This is another example in which the present invention is applied to deposit a thin film of Cu usable in the internal wiring of integrated circuits. Hexafluoroacetylacetonate (Cu $(\text{hfac})_2$) was used as a metal complex. A Si substrate coated with tantalum nitride (TaN) by 20 nm was used as a substrate.

Firstly, 150 mg of Cu$(\text{hfac})_2$ was encapsulated in the dissolving container and the substrate was installed and sealed in the reaction vessel. Then a carbon dioxide cylinder was semi-opened to circulate carbon dioxide gas entirely in the flow channel to replace the inside air by carbon dioxide. The state of the hexagonal valve is A.

Then the carbon dioxide cylinder was fully opened, so that 10 mL/min. of liquid carbon dioxide was delivered and was increased in pressure by a pump to 10 MPa as a whole. Inlet-outlet port valves at two positions on the raw material dissolving container were closed once to allow the fluid to pass through a bypass valve. This was for preventing the raw material to flow out before starting the film formation. The operation of the hexagonal valve was started, hydrogen was delivered at 0.3 L/min., and the switching cycle of the valve was State A:State B=30 seconds:10 seconds. In FIG. 4 described above, the concentration of hydrogen is about 0.08% (800 ppm).

The reaction vessel having an inner capacity of 10 mL was heated to 250° C., the bypass valve of the raw material dissolving container was closed and, simultaneously, the inlet-outlet port valves at two positions were opened to supply the raw material and the hydrogen to the reaction vessel. The inventors proved the fact that the concentration of the Cu complex is a supercritical carbon dioxide under the same condition as described above was substantially constant (0.2 mg/mLCO$_2$) by an absorptiometric analysis.

When deposition was performed for 30 minutes, a Cu thin film having metallic gloss was deposited. The thickness was 2 µm. The result of depth analysis by X-ray photoelectron spectroscopy is shown in FIG. 5. The portion where the signal intensity of Cu is strong and flat corresponds to the film, and impurities such as C and O had intensities equal to or lower than the detectable limit.

Comparative Example

Cu deposition was performed with a batch method. Another substrate was installed in the reaction vessel, the exit of the reaction vessel was sealed, and hydrogen of 0.1 MPa and the Cu complex were encapsulated therein. The amount of the Cu complex was 110 mg, and the molar ratio of Cu complex:hydrogen was the same as Examples shown above. Subsequently, liquid $CO_2$ was encapsulated, and processed at 230° C. for 30 minutes, to obtain a thin film of red copper color. The thickness was about 700 nm, and was about ⅓ of Examples shown above. I is presumed that the reaction could hardly proceed due to the accumulation of by-products in association of the deposition reaction of Cu in the closed system (see Formula 4).

$$\text{Cu(hfac)}_2 + H_2 \rightarrow \text{Cu} + 2\text{Hhfac} \quad \text{Formula 4}$$

As a result of depth analysis (FIG. 6), it was proved that a large amount of impurities such as C and O are contained in the vicinity of the surface. It is because the impurities accumulated in the system were intermixed.

Referring now to FIG. 7 and FIG. 8, another configuration of implementing the present invention will be described. An example in which $CO_2$ is used as a supercritical fluid and $H_2$ is used as additive gas will be shown.

In this configuration, the same function as the hexagonal valve is realized by combining eight valves. In FIG. 7, pipings (a) to (d) and (a') to (d') are provided with eight valves in total. However, they are omitted in FIG. 8.

The pipings (a), (a'), (b) and (b') are opened, and (d), (d'), (c) and (c') are closed. The supercritical $CO_2$ is charged in a pressure-resistant container 1, and discharged portion is supplied to the reaction vessel. On the other hand, $H_2$ is charged in a pressure-resistant container 2. This state corresponds to State A described above (State A in FIG. 8). Subsequently, when (a), (a'), (b) and (b') are closed and (d), (d'), (c) and (c') are opened, to charge the supercritical fluid in the pressure-resistant container 2. Since the supercritical fluids are completely soluble each other, $H_2$ is dissolved immediately in the supercritical $CO_2$ in the pressure-resistant container 2. The fluid mixture in the pressure-resistant container 2 is supplied to the reaction vessel, while hydrogen is discharged through the pressure-resistance container 1. This corresponds to State B described above (State B in FIG. 8). In this manner, hydrogen is charged in one pressure-resistant container while the supercritical fluid is supplied from the other pressure-resistant container. Through alternative repetition of this operation, a supercritical fluid which is a mixture of hydrogen and carbon dioxide is continuously supplied.

The mixture ratio is adjustable by changing the capacities of the pressure-resistant container 1 and the pressure-resistant container 2 and the switching intervals, but needs to be determined experimentally since excessively large volume of the containers may cause fluctuations of the pressure.

Preferably, a stirring and mixing means for internal fluid are provided in the above-described pressure-resistant container 1 and the pressure-resistant container 2. For example, a magnetic stirrer or a propeller-type stirrer may be applied.

In the configuration described above, one of the pressure-resistant container 1 and the pressure-resistant container 2 may be omitted to connect directly by piping. In this case, in the configuration using the hexagonal valve, it is needless to say that the loop piping corresponds to the pressure-resistant container, and the operation is the same in principle.

FIG. 9 is a schematic drawing showing in a simplified manner the apparatus in FIG. 1 and FIG. 2 for implementing the present invention; FIG. 10 is a principle drawing showing a measure for improvement of the apparatus shown in FIG. 1 and FIG. 2; FIG. 11 is a schematic pattern diagram showing the fluids flowing in the piping in the apparatus of FIG. 10; FIG. 12 is a schematic drawing showing a timing chart; FIG. 13 is a schematic drawing showing another example of a measure for improvement of FIG. 10; FIG. 14 is a schematic pattern diagram showing the fluids flowing in a piping according to another example of the measure for the improvement of FIG. 10; and FIG. 15 is a schematic pattern diagram showing the fluids flowing in a piping according to still another example of the measure for the improvement of FIG. 10.

FIG. 9 shows in a simplified manner an example in which the method of adding low-pressure gas according to the present invention is configured using a hexagonal valve, in which two piping connection states, that is, State A and State B of the above-described hexagonal valve 11 are shown. Hydrogen is connected to the connecting port 1, and carbon dioxide is connected to the connecting port 5. The connecting port 2 is connected to the discharge line, and the connecting port 4 is connected to the reaction vessel. Between the connecting port 3 and the connecting port 6, the piping is formed into a loop piping, and has a capacity sufficiently larger than the piping in the hexagonal valve 11. Since the entire hexagonal valve and the piping are heated to 40° C., carbon dioxide is in a supercritical state (the supercritical point is 7.4 MPa, 31° C.)

In State A in the case of FIG. 9, hydrogen (low-pressure gas) constantly flows out from the piping system wastefully, and hence it has a large drawback in terms of the cost and other points. When the flow rate is limited by providing a flow rate adjusting valve or the like in the discharge pipe or the like of hydrogen for solving such drawbacks, there are the problems that long time is required for hydrogen to flow into the loop piping 7, or insufficient addition concentration or shortage of effective hydrogen pressure is resulted when switching from State B to State A, so that the concentration of hydrogen dissolved in carbon dioxide may vary.

FIG. 10 is a principle drawing showing a measure for improvement of the above-described Examples of the present invention, in which the shut-off valve is mounted to the piping system which is connected to the connecting port 2. When the connecting port 2 is adapted to be closable in this manner, hydrogen is reliably charged in the above-described loop piping 7 which constitutes a closed container in State A.

However, in the Example shown in FIG. 10, the hydrogen is reliably charged in the above-described loop piping 7, while a means for releasing high pressure carbon dioxide charged in the above-described loop piping 7 is required.

Therefore, in the Example shown in FIG. 11, the shut-off valve 11 is mounted to the piping system connected to the connecting port 2, and a discharge valve 10 is installed in the piping system connected to the connecting port 1. It is also possible to flow back and recycle the reactant gas from the discharge valve 10 as a matter of course.

In this manner, when the connecting port 2 is adapted to be closable and the connecting port 1 is adapted to be dischargeable, hydrogen is reliably charged in the above-described loop piping 7, which serves as a closed container, in State C.

When the state is switched to State D, carbon dioxide is connected from the connecting port 4 to the reaction vessel (not shown) via the above-described loop piping 7. In other words, hydrogen charged in the loop piping 7 is pushed out toward the reaction vessel by carbon dioxide being in a supercritical state while being dissolved in the carbon dioxide, and only carbon dioxide flows in the loop piping 7.

Hydrogen in the piping system which continues to the connecting port 2 flows back and is released from the shut-off valve 11 from the discharge valve 10.

When the state is switched to State E, carbon dioxide in the above-described loop piping 7 flows back and is released from the discharge valve 10 and is brought into a standby state.

FIG. 12 shows a timing chart in this case. In this example, hydrogen flows only when the state is switched from State E to State C, and hydrogen flows only by a required amount efficiently. The above-described respective valves are of course necessary.

In the Example shown in FIG. 13, the shut-off valve 11 is mounted to the piping system connected to the connecting port 2 and then a check valve 12 is installed in the piping system connected to the connecting port 1.

In this manner, when the connecting port 2 is adapted to be closable and the discharge from the connecting port 1 is adapted to be adjustable, hydrogen is reliably charged in the above-described loop piping 7 which serves as a closed container in State C.

Subsequently, when the state is switched to State D, carbon dioxide is connected from the connecting port 4 to the reaction vessel (not shown) via the above-described loop piping 7. In other words, hydrogen charged in the loop piping 7 is pushed out toward the reaction vessel by carbon dioxide being in a supercritical state while being dissolved in the carbon dioxide, and hence only carbon dioxide flows in the loop piping 7.

Hydrogen in the piping system connected to the connecting port 2 is still held in the piping system by the check valve 12.

When the state is switched to State E, carbon dioxide in the above-described loop piping 7 flows back and is released from the check valve 12, and is brought into a standby state.

FIG. 14 shows an example in which a plurality of valves are used instead of the hexagonal valve, and a storage container or the like other than the loop piping is used as a storage means for hydrogen gas. In this example, switch valves A-1, A-2 are provided in front and back of the storage container 13 in a flow channel of fluid A, and a switch valve B-1 is provided in a flow channel of fluid B before joining with the flow channel of the fluid A. Provided between the switch valve A-1 and the storage container 13 is a bypass pipe 14 having a switch valve B-2 between the flow channel of fluid A and the flow channel of fluid B, and a discharge valve 15 is also provided separately.

In the configuration of the storage container and the switch valves, the switch valve A-1 of the flow channel of fluid A and the switch valve B-1 of the flow channel of fluid B are opened to store hydrogen in the storage container 13 in State (1).

In State (2), the switch valve A-1 of the flow channel of fluid A and the switch valve B-1 of the flow channel of fluid B are closed, and the switch valve B-2 of the bypass piping and the switch valve B-2 of the flow channel of the fluid B are opened to pump carbon dioxide, so that hydrogen stored in the storage container 13 is delivered to a pressure container together with carbon dioxide.

In the state (3), when the switch valve B-2 of the bypass pipe 14 and the switch valve A-2 of the flow channel of the fluid A are closed, and the discharge valve 15 and the switch valve B-1 of the flow channel of the fluid B are opened, carbon dioxide in the storage container 13 is released from the discharge valve 15.

In the Example in FIG. 15, a plurality of valves are used, and a loop piping is used as a storage means for hydrogen. In this example, switch valves A-1, A-2 are provided in front and back of the loop piping 7, and a switch valve B-1 is provided in the flow channel of the fluid B before joining with the flow channel of the fluid A. Provided between the switch valve A-1 and the loop piping 7 is a bypass pipe 14 provided with a switch valve B-2 between the flow channel of the fluid A and the flow channel of the fluid B, and a discharge valve 15 is provided on the downstream side of the loop piping 7.

In the configuration of the loop piping and the switch valves, in the state (1), the switch valve A-1 of the flow channel of the fluid A and the switch valve B-1 of the flow channel of the fluid B are opened to store hydrogen in the loop piping 7.

In the state (2), the switch valve A-1 of the flow channel of the fluid A and the switch valve B-1 of the flow channel of the fluid B are closed and the switch valve B-2 of the bypass pipe 14 and the switch valve A-2 of the flow channel of the fluid A are opened to pump carbon dioxide, and hydrogen stored in the loop piping 7 is delivered to a pressure container together with carbon dioxide.

In the state (3), when the switch valve B-2 of the bypass pipe 14 and the switch valve A-2 of the flow channel of the fluid A are closed and the discharge valve 15 and the switch valve B-1 of the flow channel of the fluid B are opened, carbon dioxide in the loop piping 7 is released from the discharge valve 15.

In the Examples shown in FIG. 10 to FIG. 15, in State A, hydrogen (low-pressure gas) is prevented or alleviated from flowing out constantly from the piping system, so that the effective usage of hydrogen is achieved. Also, insufficient addition concentration or shortage of effective hydrogen pressure of hydrogen (low-pressure gas) is solved, and hence the concentration of hydrogen dissolved in carbon dioxide can be uniformized.

The supercritical fluid in the present invention may be widely selected from the group of water, alcohols, ketones, carbon halide, flons, ammonia, rare gases, nitrogen, which are known by those skilled in the art, in addition to carbon dioxide.

The additive gas is not limited to hydrogen, and any gas necessary for synthesis may be used, such as oxygen, air, nitrogen monoxide, ozone, ammonia, carbon monoxide, sulfides such as hydrogen sulfide, and hydrocarbons such as methane.

INDUSTRIAL APPLICABILITY

The present invention may be utilized not only in a film forming process for forming a thin film on a substrate by dissolving a reaction auxiliary and a metal precursor in a supercritical fluid or a subcritical fluid but also in the microfabrication process represented by various integrated circuit processes or MEMS.

Figure 1:
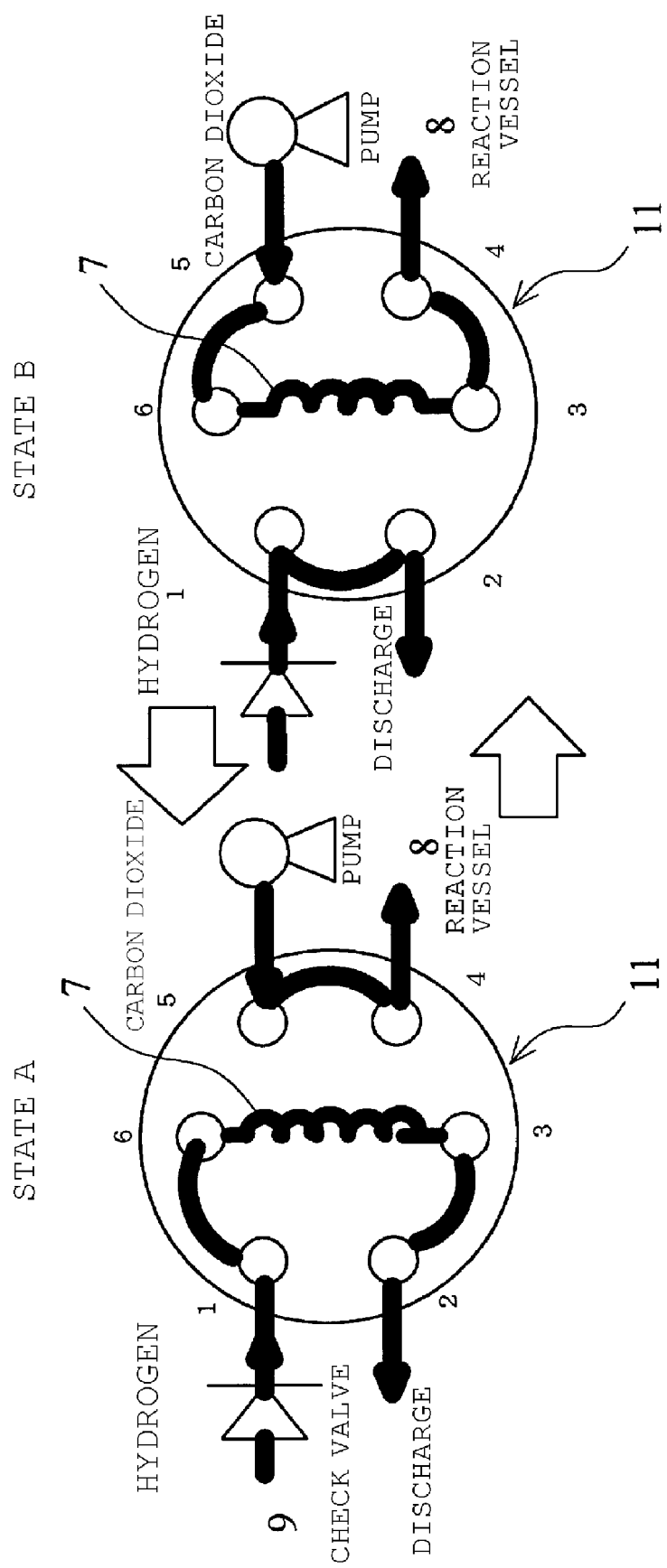
FIG. 1 is a schematic drawing showing an example of a configuration of an apparatus for implementing the present invention.
Figure 2:
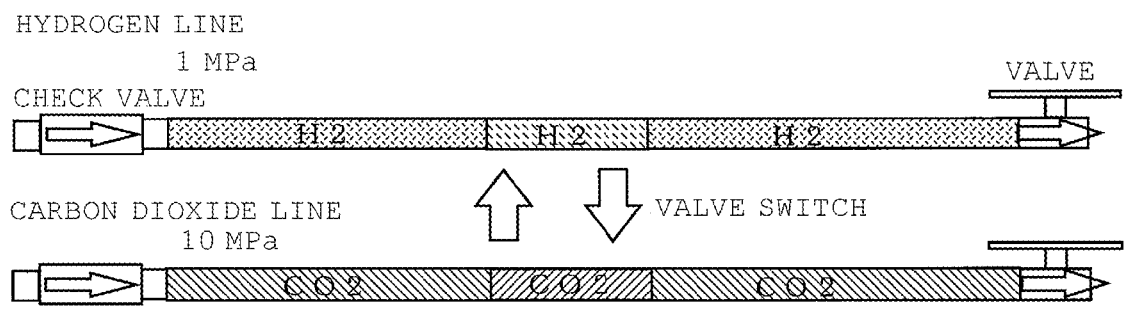
FIG. 2 is a schematic pattern diagram showing fluids flowing in a piping.
Figure 2:
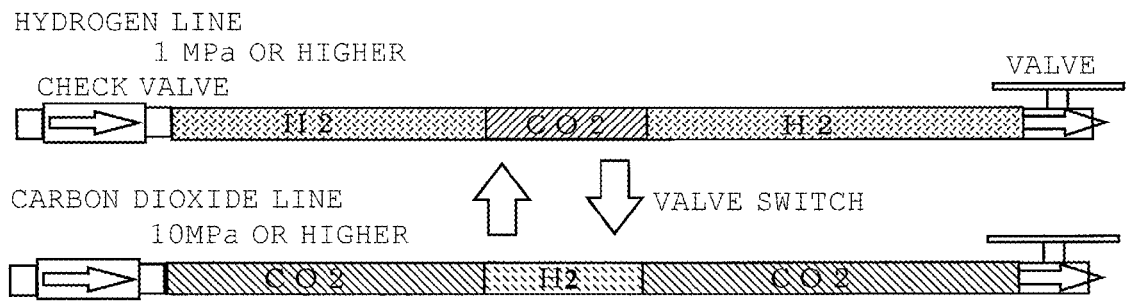
Figure 2:
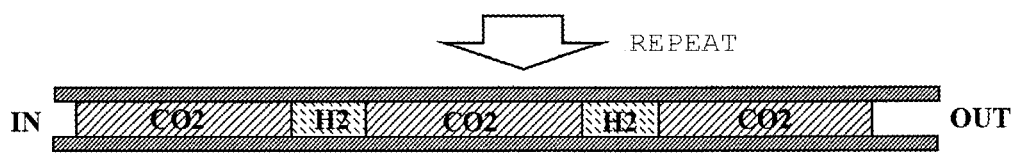
Figure 3:
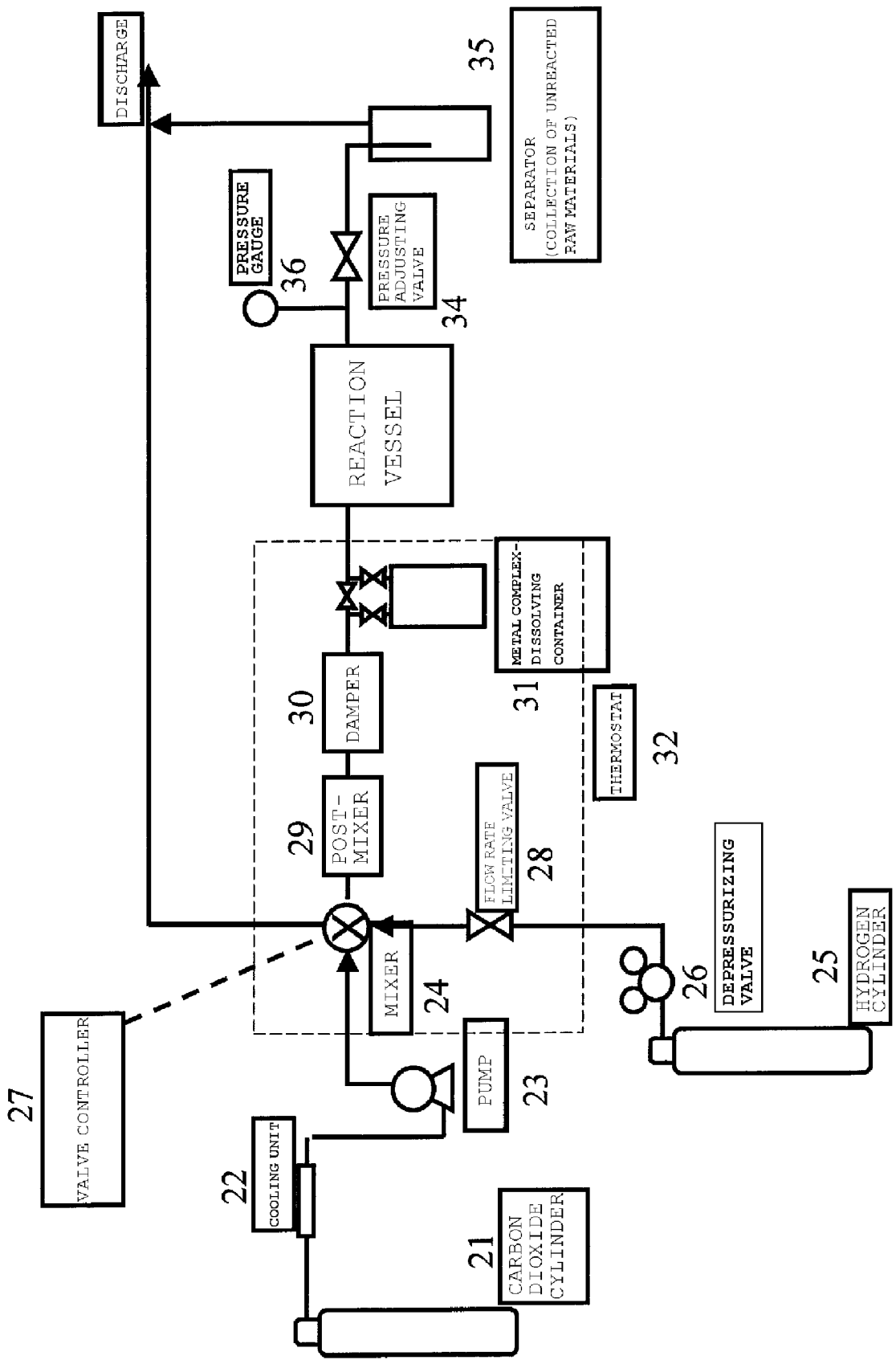
FIG. 3 is a schematic drawing showing an example of a thin film deposition apparatus configured using a hydrogen mixer to which the present invention is applied.
Figure 4:
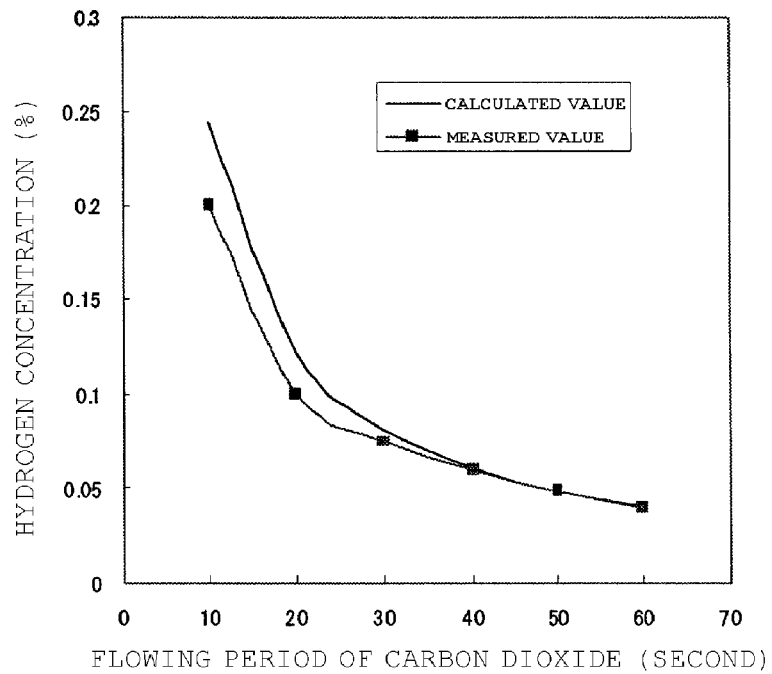
FIG. 4 is a graph showing a result obtained by Example 1.
Figure 5:
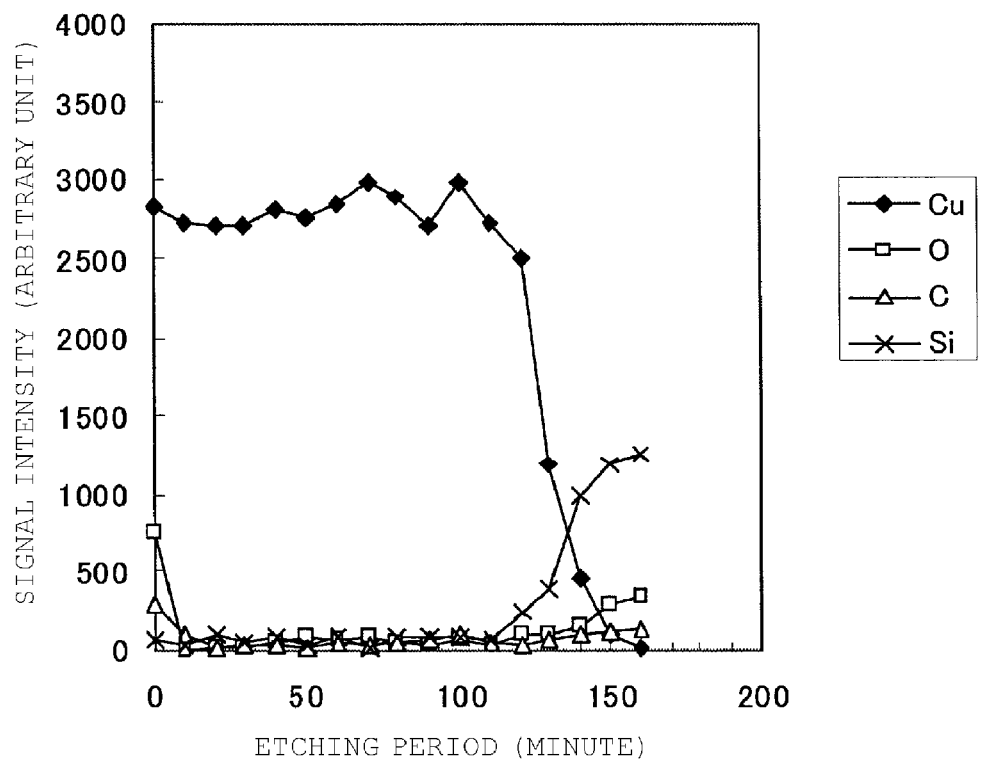
FIG. 5 is a graph showing a result obtaining by Example 2.
Figure 6:
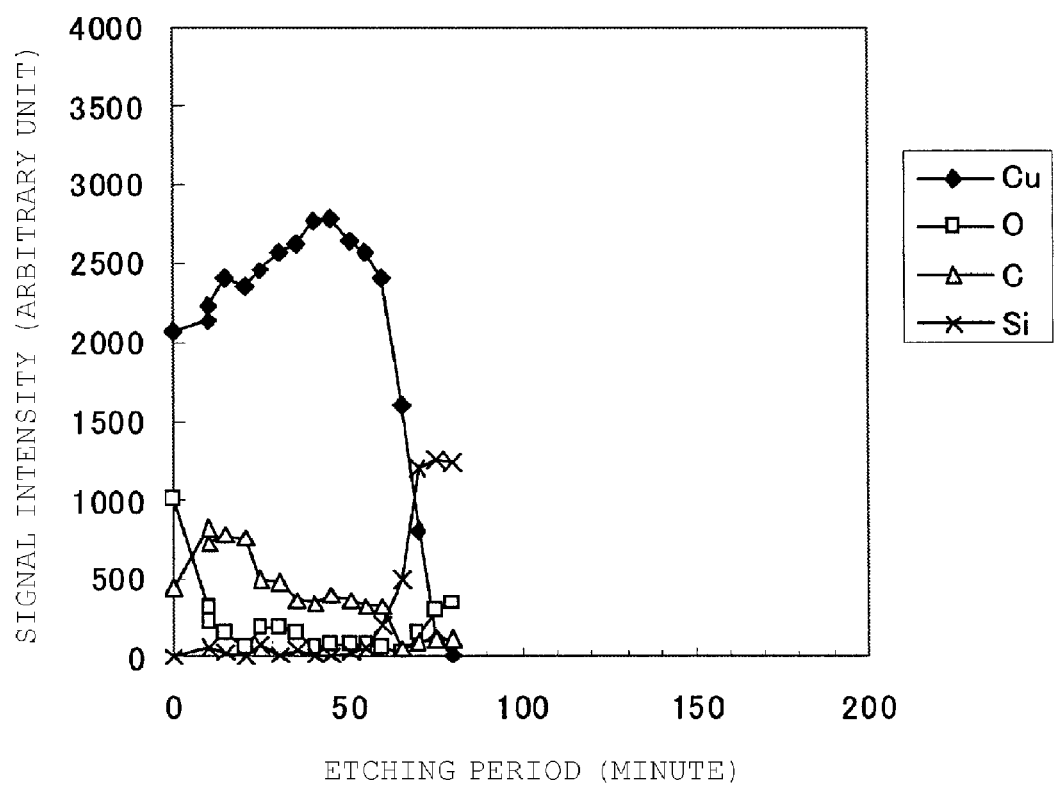
FIG. 6 is a graph showing a result obtained by Comparative Example.
Figure 7:
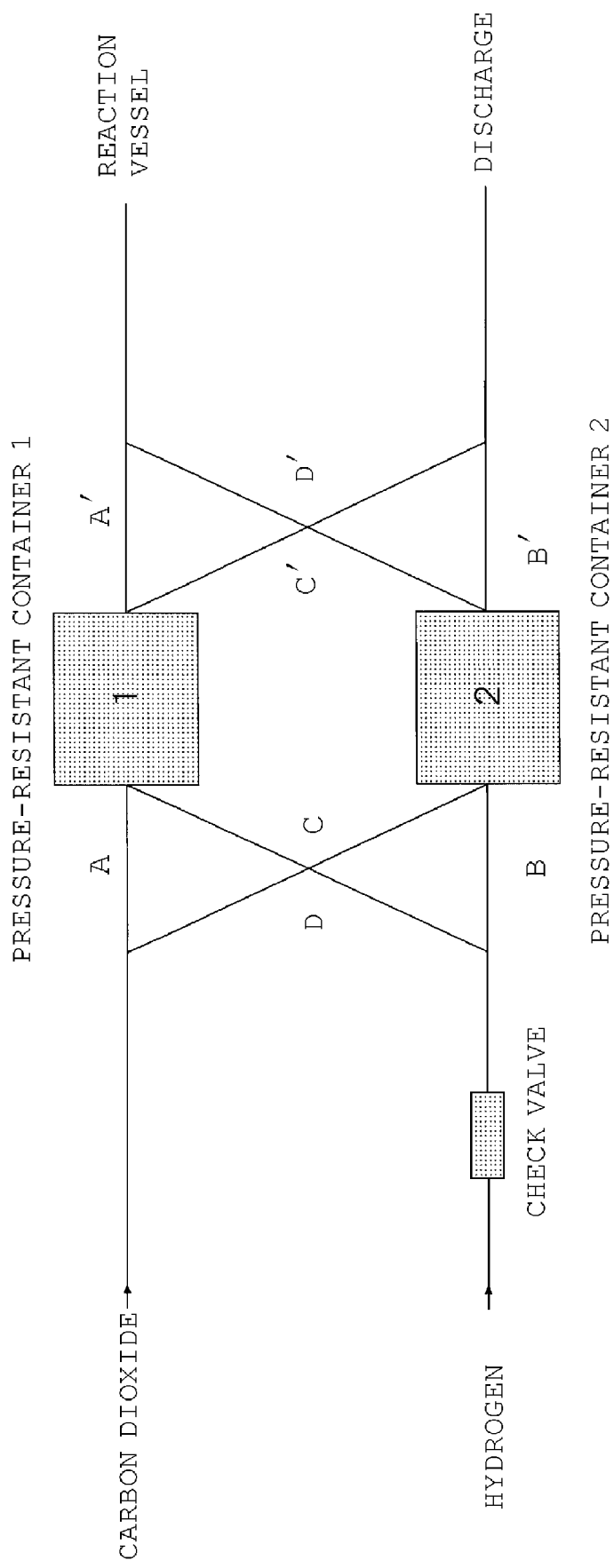
FIG. 7 is a schematic drawing showing another configuration of an apparatus for implementing the present invention.
Figure 8:
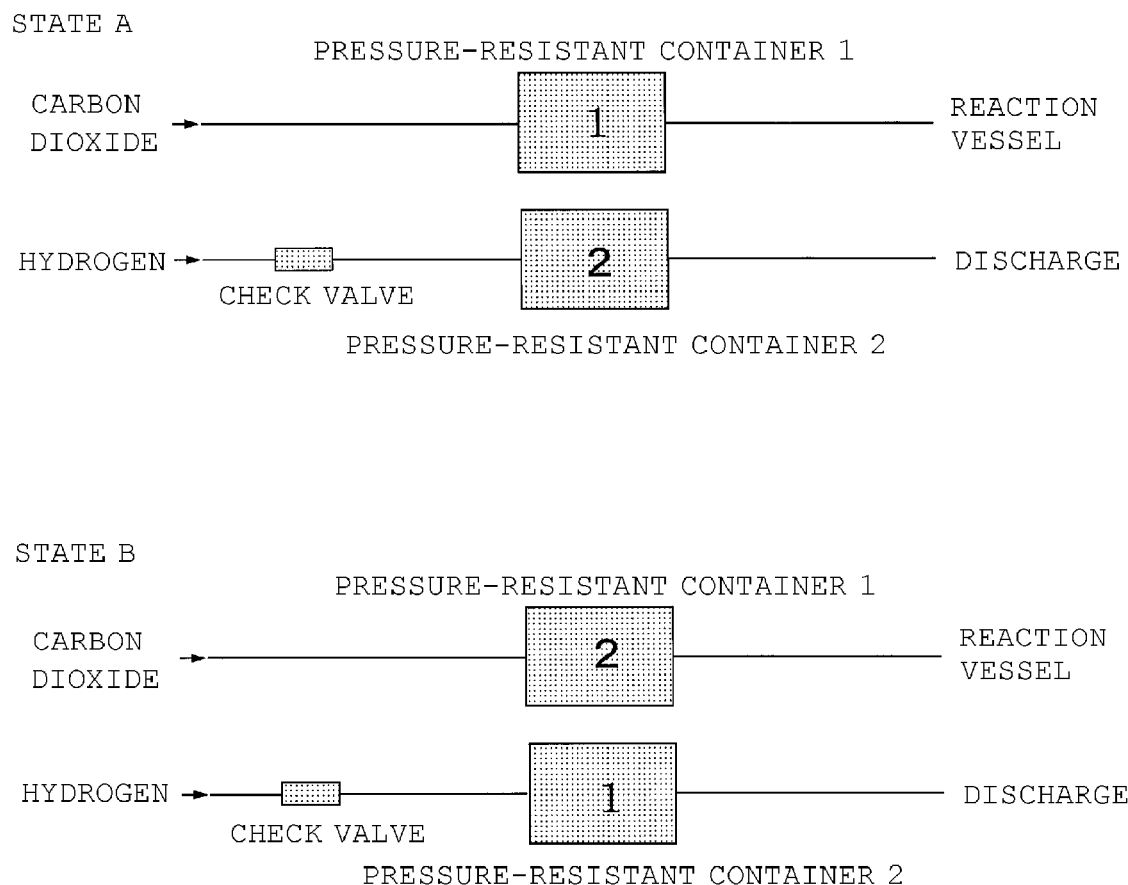
FIG. 8 is a schematic pattern diagram showing fluid flowing in a piping.
Figure 9:
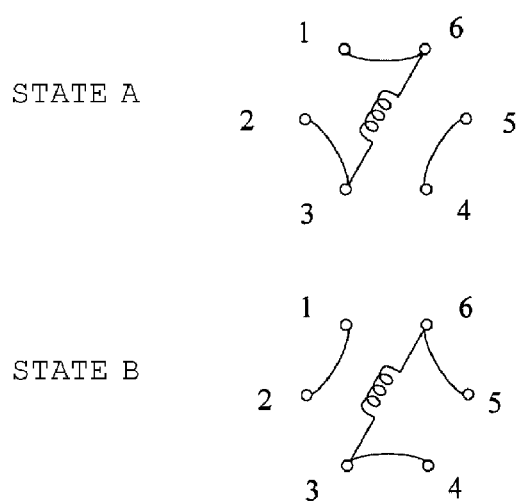
FIG. 9 is a schematic drawing showing in a simplified manner the apparatus of FIG. 1 and FIG. 2 for implementing the present invention.
Figure 10:
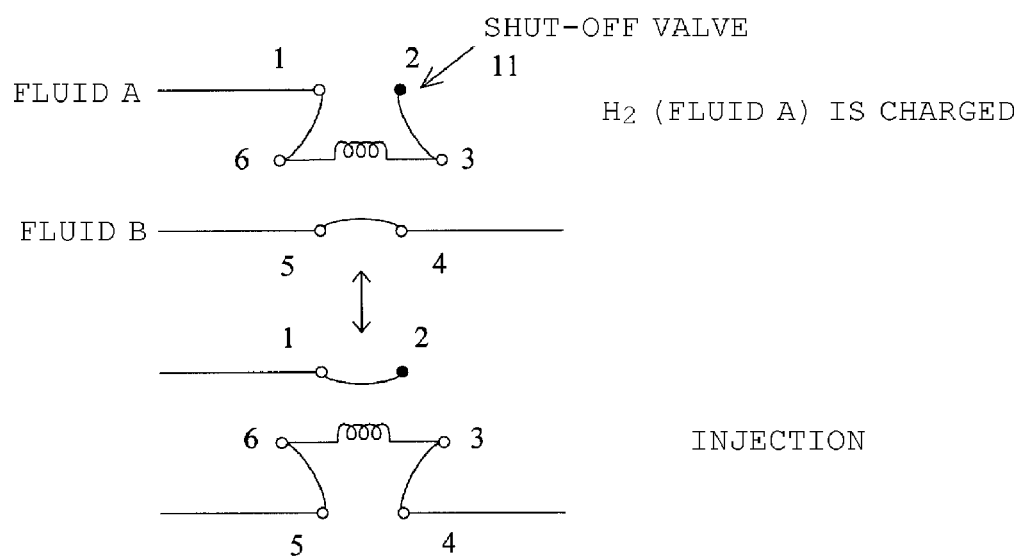
FIG. 10 is a principle drawing showing a measure for improvement of the apparatus shown in FIG. 1 and FIG. 2.
Figure 11:
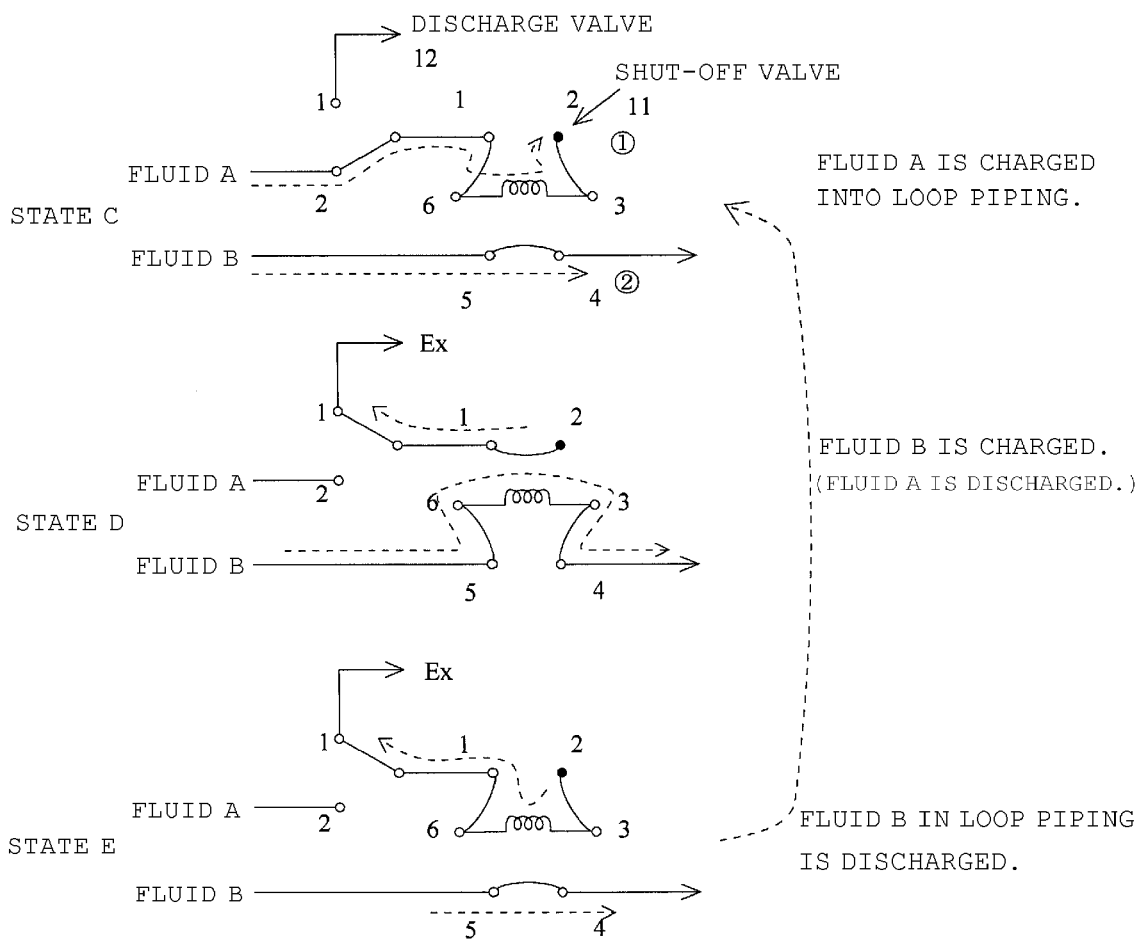
FIG. 11 is a schematic pattern diagram showing fluids flowing in the piping in the apparatus of FIG. 10.
Figure 12:
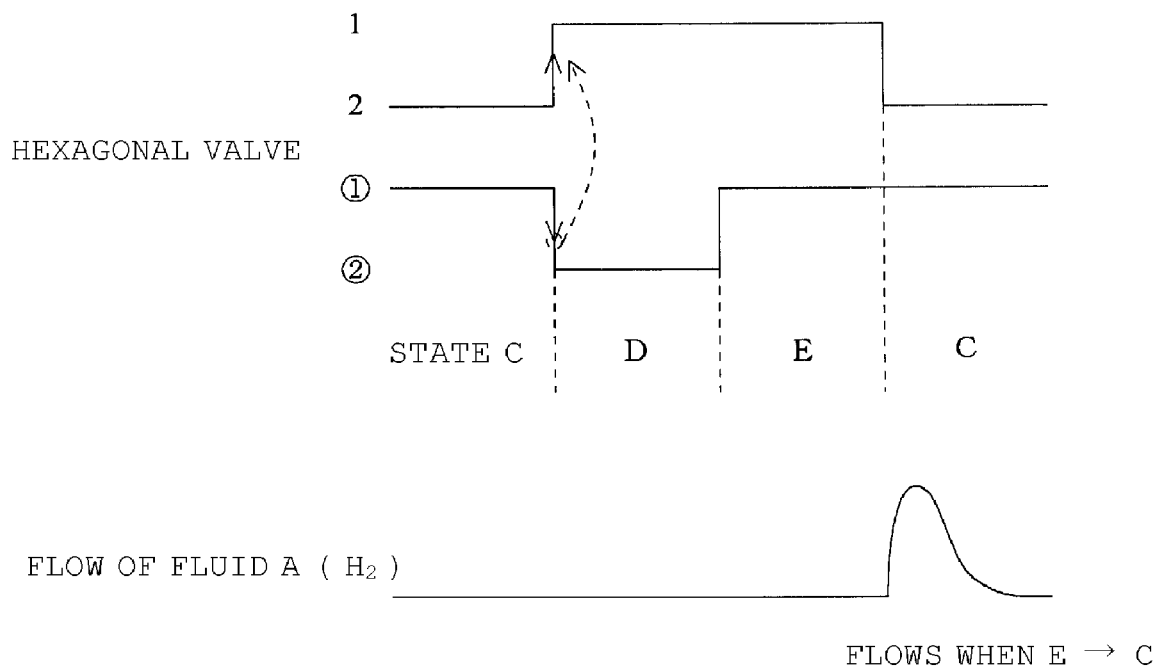
FIG. 12 is a schematic drawing showing a timing chart.
Figure 13:
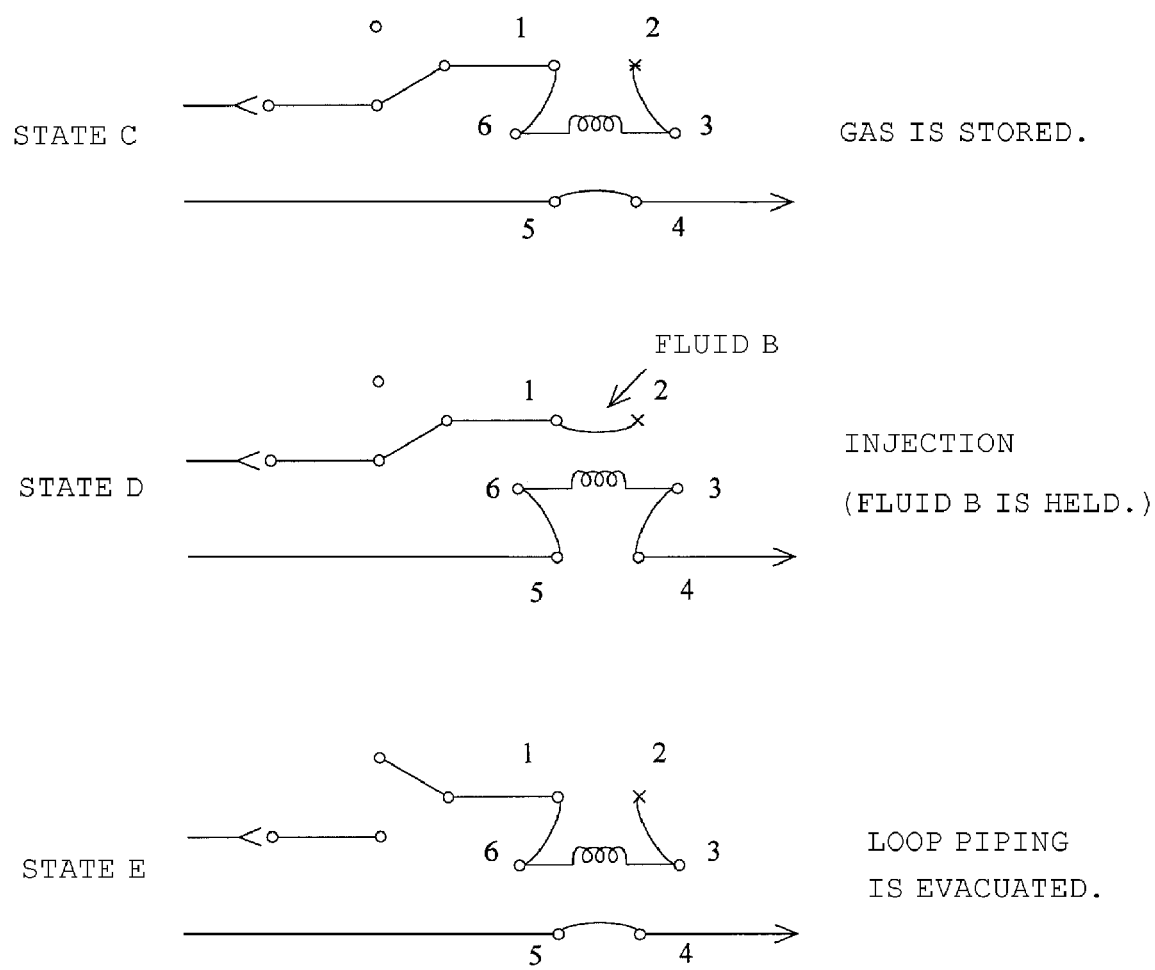
FIG. 13 is a schematic drawing showing another example of a measure for improvement of FIG. 10.
Figure 14:
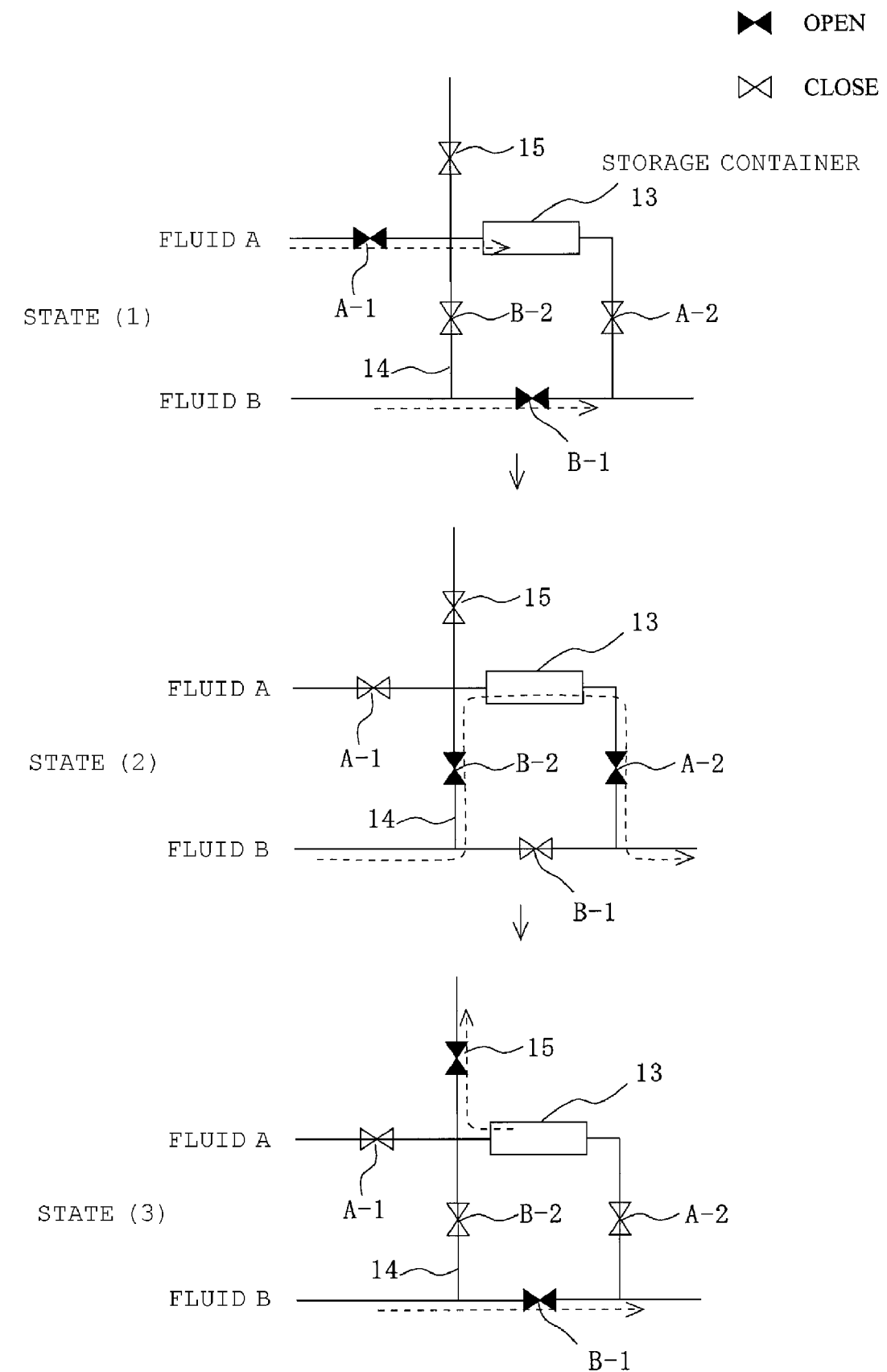
FIG. 14 is a schematic pattern diagram showing fluid flowing in a piping according to another example of the measure for improvement of FIG. 10.
Figure 15:
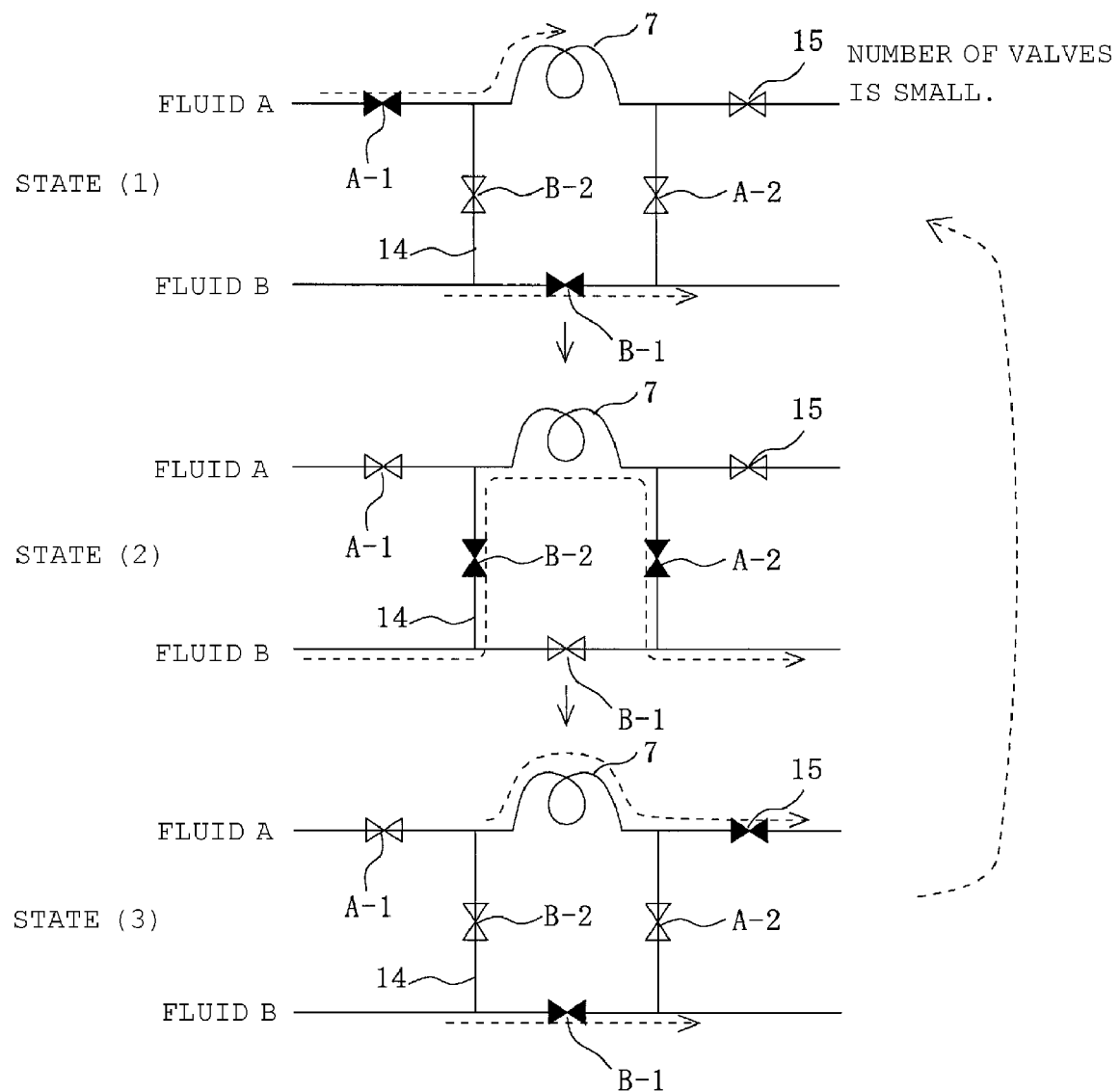
FIG. 15 is a schematic pattern diagram showing fluid flowing in a piping according to still another example of the measure for improvement of FIG. 10.

REFERENCE NUMERALS 7 loop piping
8 reaction vessel
9 check valve
11 hexagonal valve
21 carbon dioxide cylinder
22 cooling unit
23 pump
24 mixer
25 hydrogen cylinder
26 depressurizing valve
27 valve controller
28 flow rate adjusting valve
29 post-mixer
30 shock absorber (damper)
31 dissolving container
32 thermostat
34 pressure adjusting valve
35 separator
36 pressure gauge

The invention claimed is:

1. A method of adding a low-pressure gas continuously to a supercritical fluid comprising supplying a reactant gas to a supercritical fluid or a subcritical fluid by repeating, in an alternate manner, a step of storing the reactant gas midway through a piping in a low-pressure state and a step of carrying the reaction gas toward a reaction vessel with the supercritical fluid or the subcritical fluid, so that the reactant gas is continuously charged in the reaction vessel.

2. The method of adding a low-pressure gas continuously to a supercritical fluid according to claim 1, wherein the step of storing the reactant gas in a low-pressure state is performed at a temperature being maintained at a supercritical or subcritical temperature or higher.

3. An apparatus for adding a low-pressure gas continuously to a supercritical fluid comprising; a piping system for transporting a supercritical fluid or a subcritical fluid to a reaction vessel and a piping system for adding and mixing a reactant gas at an adding and mixing portion midway through the piping system, wherein the adding and mixing portion comprises a means for storing the reactant gas in a low-pressure state, a means for carrying the stored reactant gas toward the reaction vessel with the supercritical fluid or the subcritical fluid, and a switch valve for switching the respective means.

4. The apparatus for adding a low-pressure gas continuously to a supercritical fluid according to claim 3, wherein the means for storing the reactant gas in a low-pressure state has a stirring means.

5. The apparatus for adding a low-pressure gas continuously to a supercritical fluid according to claim 3, wherein the switch valve for switching the means for storing the reactant gas in a low-pressure state and the means for carrying the stored reactant gas toward the reaction vessel with the supercritical fluid or the subcritical fluid is a hexagonal valve.

6. The apparatus for adding a low-pressure gas continuously to a supercritical fluid according to claim 3, wherein the switch valve integrates therein the means for storing the reaction gas in a low-pressure state.

7. The apparatus for adding a low-pressure gas continuously to a supercritical fluid according to claim 6, wherein the means for storing the reactant gas in a low-pressure state integrated in the switch valve includes a loop piping, so that a fluid comprising the supercritical fluid or the subcritical fluid and the reactant gas is stirred to accelerate mixing thereof while passing through the loop piping.

8. The apparatus for adding a low-pressure gas continuously to a supercritical fluid according to claim 6, wherein the means for storing the reactant gas in a low-pressure state integrated in the switch valve includes a pressure-resistant container having a stirring means, so that a fluid comprising the supercritical fluid or the subcritical fluid and the reactant gas is stirred in the pressure-resistant container to accelerate mixing.

9. The apparatus for adding a low-pressure gas continuously to a supercritical fluid according to claim 3, wherein a check valve for the supercritical fluid or the subcritical fluid is provided in the piping system for adding and mixing the reactant gas.

10. The apparatus for adding a low-pressure gas continuously to a supercritical fluid according to claim 3, wherein a shut-off valve for the reaction gas is provided in the piping system for adding and mixing the reactant gas.

\* \* \* \* \*